United States Patent [19]
Eggers et al.

[11] Patent Number: 4,659,425
[45] Date of Patent: Apr. 21, 1987

[54] CONTINUOUS PROCESS FOR THE MANUFACTURE OF PRINTED CIRCUIT BOARDS

[75] Inventors: Eugene A. Eggers, Binghamton; William J. Summa, Endwell, both of N.Y.

[73] Assignee: IBM Corporation, Armonk, N.Y.

[21] Appl. No.: 825,562

[22] Filed: Feb. 3, 1986

[51] Int. Cl.[4] .......................... B44C 1/22; B32B 31/08
[52] U.S. Cl. .................................. 156/630; 156/322; 156/324; 156/330; 156/583.5
[58] Field of Search ............ 156/324, 330, 322, 583.5, 156/630

[56] References Cited

U.S. PATENT DOCUMENTS 4,191,800  3/1980  Holtzman ........................... 428/251
4,284,753  8/1981  Hewitt .................................. 528/89
4,372,800  2/1983  Oizumi et al. ..................... 156/307.3
4,451,317  5/1984  Oizumi et al. ..................... 156/307.3
4,557,784  12/1985 Vekita et al. ..................... 156/324 X
4,579,612  4/1986  Held ................................. 156/324 X Primary Examiner—Robert A. Dawson
Attorney, Agent, or Firm—Perman & Green

[57] ABSTRACT

A continuous method for the manufacture of a circuit board wherein a coating of a solvent-free thermosetting resin is applied to the surface of a metal foil. The resin coated foil is advanced into contact with a reinforcing cloth sheet layer to form a foil/cloth assembly. The assembly is continuously conveyed between a pair of endless belts revolving in opposite directions with mutually facing surfaces, the belts being heated to the curing temperature of the resin whereby the belts are pressed against the assembly to continuously compact the assembly and cure the resin to form a composite product which can then be circuitized from a printed circuit board.

8 Claims, 2 Drawing Figures

CONTINUOUS PROCESS FOR THE MANUFACTURE OF PRINTED CIRCUIT BOARDS

BACKGROUND OF THE INVENTION

1. Field of the Invention

This invention relates to a process for the manufacture of electronic printed circuit boards, and in particular to a continuous method for the production of such printed circuit boards.

2. The Prior Art

In the manufacture of electronic devices, such as computers, printed circuit boards are widely used to support discrete electronic components and to provide the electrical circuitry between the components. Commercial electronic computers have become more powerful since their introduction, yet they have been reduced in physical dimensions from room size to desk size. As their size has decreased and the number of interconnections due to more powerful logic has increased, the printed circuit boards used have become denser and more complex. Today's printed circuit boards can be extremely dense, with very small geometrics and with many layers.

The printed circuit boards are a composite structure having a central core typically a dielectric material such as a reinforcing cloth formed from a material such as glass fiber and a thermosetting resin such as an epoxy resin referred to in the art as a "prepreg". The term "prepreg" is derived from the fact that the reinforcing cloth, e.g. a glass fiber cloth, is preimpregnated with a volatile solution containing primarily a thermosetting resin such as an epoxy resin, catalysts and/or curing agents for the resin. The prepreg has applied on at either side thereof, metallized circuitry, usually formed of metal foil such as copper foil. The metal foil is etched or otherwise processed to provide circuits of predetermined geometrical configuration. The printed circuit board may be a two-sided composite board having circuitry on the top and bottom sides of the dielectric layer, or it may be a laminated multilayer board which also contains internal signal lines and power planes, referred to in the art as a 2s,2p structure, separated by a dielectric material. The laminated multilayer 2s,2p printed circuit boards are prepared from individual composite circuit boards which are laminated to form the multilayer structure having the etched metal circuitry sandwiched between the prepreg layers. The laminated multilayer boards are provided with through via holes and interstitial via holes to interconnect the various circuit lines and power planes.

In the manufacture of the prepreg used in the printed circuit board the reinforcing cloth suitably a glass fiber cloth is impregnated with the thermosetting resin solution, by passing the cloth through a bath of the resin solution. After removal from the impregnation bath, the prepreg is heated to remove the solvent. When the resin is an epoxy resin, the prepreg is heated at about 100° to 150° C. to remove the solvent and to partially cure, i.e., advance the epoxy resin to the B-stage. Thereafter, the prepreg is laminated batchwise on either side with a conductive material such as a thin, e.g. 1.0–2.0 mils thick, copper foil to form an individual circuit board, or the individual boards once the circuitry is defined, may be laminated, using the prepreg as the laminating layer to form multilayer structures.

One drawback to the prior art processes used for the manufacture of printed circuit boards is that under the conditions of manufacture, the prepreg sheet product contains a large number of voids which are formed due to air entrapment in the prepreg during the solvent removal step of the manufacturing process. The presence of voids in the printed circuit board laminate structure promotes the deterioration of laminate integrity at the interfaces between adjacent layers and leads to metal, e.g. copper, migration and the formation of short circuits between plated through holes and power planes present in the printed circuit board.

One method used by the art to eliminate voids, or entrapped air from the printed circuit board has been to subject the laminate structure immediately after formation, to heat, e.g. 125° to 140° C., as well as a considerable degree of compression, e.g. 200 to 700 psi for prolonged periods of up to several hours on a batchwise basis. This procedure besides being time consuming adds substantial cost to the manufacturing process.

Another method disclosed by the prior art to eliminate voids in printed circuit boards is disclosed in U.S. Pat. Nos. 4,372,800 and 4,451,317. These patents disclose a continuous method for the production of printed circuit board laminates wherein the thermosetting resin formulation used in the manufacturing process is a liquid unsaturated polyester resin which is free of volatile solvent and is capable of curing without generating liquid and gaseous byproducts.

However, a drawback to the process disclosed in U.S. Pat. Nos. 4,372,800 and 4,451,317 is that to obtain proper adhesion of the metal, e.g. copper, foil layer, to the prepreg layer of the laminate, the use of adhesives such as epoxy resins is required. This requirement has the disadvantage of another resin-resin interface, plus the disadvantage of additional coating stations during processing.

There is, therefore, a need in the art for a process to eliminate or substantially reduce voids in printed circuit boards which process is continuous and avoids the use of an adhesive layer to bond the metal foil layer to the prepreg layer.

SUMMARY OF THE INVENTION

In accordance with the present invention, there is provided a continuous method for the manufacture of a composite circuit board which includes the steps of (1) coating the surface of a metal foil with a layer of a liquid thermosetting resin free of a volatile solvent, (2) heating the foil to a temperature below the curing temperature of the resin to further fluidize the resin, (3) advancing the resin coated foil into contact with a reinforcing cloth sheet to form a foil/cloth assembly, (4) continuously conveying the assembly between a pair of rotating endless belts having mutually facing surfaces which are pressable against one another in a heating zone heated to the curing temperature of the resin, (5) pressing the mutually facing surfaces of the belts against the assembly to simultaneously compress the assembly and impregnate the assembly with the resin, (6) curing the resin in the heating zone whereby there is formed a composite structure bonded together with the cured resin, and then (7) continuously cooling the composite structure while compressed by the belts to obtain the circuit board.

In the process of the present invention, no adhesive is required as the thermosetting resin is uniformly distributed throughout the composite product by the pressing action of the rotating belts, the resin functions as an adhesive for the various layers of the composite product. The use in the process of the present invention of a liquid thermosetting resin composition which is free of volatile solvents eliminates the need for a drying step and substantially reduces the presence of voids in the composite circuit board product thereby increasing the efficiency of the process and improving the quality of the board product. Further process efficiencies are attained by the fact that due to the continuous uniform action of the double belt compression of the assembled board components, preimpregnation of the reinforcing cloth is unnecessary. The elimination of the prepreg preparation step contributes substantially to the efficiency of manufacture of the circuit boards as well as reducing the costs associated with the inventory and handling of prepregs characteristic of prior art processes.

In the process of the present invention, a compressive force is continuously and uniformly applied to the board assembly during the heat curing of the assembly. The compressive force applied to the board assembly during the heat curing step is in the order of about 20 to about 100 psi and preferably about 30 to about 50 psi. Due to the limited compressive force applied to the board assembly, a minimum of strain is created in the board product thereby producing a product of superior dimensional stability and permitting the use of nonwoven or other low cost, low tensile strength reinforcing materials in the manufacture of the circuit board product.

BRIEF DESCRIPTION OF THE DRAWING

The invention is illustrated by means of the embodiments thereof shown in the drawing and explained in the description to follow hereinafter. In the drawing.

DETAILED DESCRIPTION OF THE INVENTION

Figure 1:
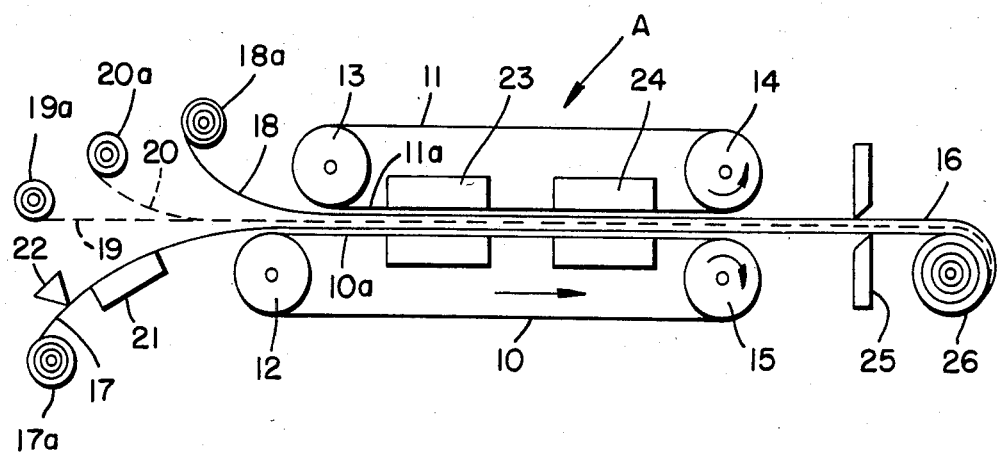
FIG. 1 shows a schematic longitudinal section through a double belt press laminator used in practicing the process of the present invention to form a composite circuit board.

In FIG. 1, there is shown a double belt press laminating device A which is constructed of two continuous rotating stainless steel belts 10,11 arranged in superimposed relationship, one above the other with mutually facing surfaces 10a,11a and guided by associated idler rolls 12,13 and by driven rolls 14,15. The power drive, not shown, is effected synchronously in a known manner so that the mutually facing sides 10a,11a of the belts 10,11 travel at the same speed in the direction of the arrows on the driven rolls 14,15, and form a gap or nip therebetween capable of accepting, in a known manner, metal foil and reinforcing cloth to form the circuit board product 16.

In operation, to manufacture the circuit board 16, individual metal foil sheet 17,18 having a thickness of about 0.5 to about 3.0 mils and individual reinforcing cloth sheets 19,20 having a thickness of about 1.5 to about 7.0 mils are simultaneously and continuously unwound from their respective supply rolls 17a,18a,19a and 20a and passed under the guide rolls 12,13 of the double belt press laminator A. Prior to its being fed under the guide rolls of the double belt press laminator, one of the metal foils, namely metal foil 17, is passed over heating plate 21.

As the metal foil 17 is unwound from the roll 17a, and prior to its passage over the heating plate 21, there is cast onto the upper surface of the metal foil 17, from a coating device 22, a flow of liquid thermosetting resin, to provide a layer of about 2 to about 10 mils thick on the foil. The coating device 22 may be a knife coater, gravure coater, reverse roll coater of a hydropneumatic coating device which delivers a predetermined amount of liquid thermosetting resin to the upper surface of the metal foil. By selectively adjusting the applied resin coating thickness to that required for total wetting and impregnation of the cloth sheets, removal of excess amounts of the resin from the assembled metal foil and cloth layers is thereby avoided. For example, when two fiberglass reinforcing cloth sheets of 3 mils thickness each are employed in the manufacture of the circuit board product 16, the application to a copper foil surface of a liquid epoxy resin layer of about 5 mils thickness will be adequate to completely wet and impregnate the cloths during their passage through the double belt laminator A. The heating of the liquid thermosetting resin coated metal foil 17 as it is passed over the heating plate 21 fluidizes, i.e., lowers the viscosity of the liquid resin, so that the resin will readily wet, permeate and impregnate the reinforcing cloth sheets 19,20 as the cloth sheets are compressed into contact with the liquid thermosetting resin coated metal foil, the foils and cloth sheets are continuously passed between the belts 10,11 during their passage through the double press laminator. For example, liquid thermosetting resin compositions, such as epoxy resins can be formulated to have viscosities in the range of 0.5 to 30 poise at 25° C. When heated at about 80° C. to about 125° C., the viscosity is lowered to about 5000 to 50 centipoise whereby the heated resin composition will readily permeate through several layers of reinforcing cloth such as those constructed of glass fibers. When moving at a line speed of 3 to 12 feet per minute (fpm), a 5 mil layer of liquid thermosetting resin such as an epoxy resin cast onto the metal foil surface and heated to 80° C. to 125° C. will wet and completely permeate two 3 mil thick fiberglass reinforcing cloths being compressed into contact with the coated metal foil surfaces within 15 to 45 seconds.

As no time is required for the removal of solvent from the impregnated reinforcing cloth layers, the assembly of metal foil and reinforcing cloth layers passed under the rolls 12,13 may be passed directly to a heating zone to raise the resin to its curing temperature. As shown in FIG. 1, the liquid thermosetting resin coated metal foil sheet 17, the reinforcing cloth sheets 19,20 and the second metal foil sheet 18 are continuously transferred in parallel between the idler rolls 12,13 and continuously compressed together surface-to-surface by the pair of endless belts 10,11 whereby the reinforcing cloth layers 19,20 are simultaneously sandwiched and compressed between the metal foils 17 and 18. The compressive force at which the metal foil and cloth sheets are compressed together as they initially enter double press laminator A between the rolls 12,13 generally ranges from 20 to 100 pounds per square inch (psi) and preferably from 30 to 50 psi.

The metal foil/cloth assembly is guided from between the rolls 12,13 to heat curing zone 23. Within the heat curing zone 23 means, not shown, are provided to heat the belts 10,11 to the temperature required for lamination of the assembly, pressing means, not shown, are associated, in a known manner, with each belt 10,11. The pressing means causes the mutually facing sides 10a,11a of the belts 10,11 to be pressed against each other and against the metal foil/cloth assembly whereby the assembly is further compressed together to insure that the liquid thermosetting resin flows through the entire assembly so as to fully contact all the layers of the assembly. The compressive force at which the metal foil/cloth assembly is pressed by the belts 10,11 within the heating zone 23 generally ranges from about 20 to about 100 psi and preferably about 30 to about 50 psi. Simultaneous with the pressing action of the belts, the temperature of the assembly is raised in the heating zone to the curing temperature of the liquid thermosetting resin. Each of the metal foil layers 17,18 are bonded to the opposite surfaces of the resin impregnated reinforcing cloths 19,20 by the cured resin under the heat generated in heating zone 23 and the pressure applied thereto by the belts 10,11.

When the liquid thermosetting resin used to impregnate the reinforcing cloths 19,20 is an epoxy resin, the curing temperature varies from about 150° to about 200° C., with a preferred curing temperature of about 160° to about 170° C.

The compressive force applied to the metal foil/cloth assembly within the heating zone by the belts 10,11 is the minimum pressure required to effect resin flow through the assembly and generally varies from about 20 to about 100 psi and preferably about 30 to about 50 psi. Passage of the metal foil/cloth assembly through the heating zone 23 proceeds at the rate of about 3 to about 12 fpm for a total residence time in the heating zone of about 120 to about 480 seconds.

After passage through the heating zone 21, the metal foil/cloth assembly is guided to a cooling zone 24.

The arrangement of heating zone 23 is provided in principle in the cooling zone 24, except provision is made to perform a cooling rather than heating function. Thus, within the cooling zone 24 there is provided pressing means, not shown, which, as in the heating zone, are associated in a known manner, with each belt 10,11. The pressing means causes the mutually facing sides 10a,11a of the belts to be pressed against each other and against the metal foils 17,18 so that the assembly remains under the same compression previously imposed in the heating zone 23 as the assembly undergoes cooling in the zone 24.

Heat transfer means, not shown, provided in the zone 24 effect a cooling of the belts via heat conduction whereby the composite product 16 which exits the heating zone 23 in a heated condition is abruptly cooled to a temperature of about 40° to 50° C. in zone 24. The heat transfer means provided in cooling zone 24 may be supplemented by a flow of cooling air in the chamber of the cooling zone 22 which by means of forced convection, augments the cooling of the composite product 16 by the belts 10,11.

After exiting cooling zone 24, the cooled composite product 16, if it is relatively thick, e.g. 15 to 60 mils, may be cut into predetermined lengths or panels using cutting device 25 or the composite product 16 may be wound on roll 26 for storage if it is a relatively thin material, e.g., 5-10 mils thick.

Although the short-time laminating steps of the process of the present invention imparts to the composite product 16 those fundamental properties which are required for printed circuit boards, it is also preferable to subject the composite product once obtained to a post-baking treatment. By such treatment, the composite product is further improved in heat resistance as well as dimensional stability owing to the removal of strain. Thus, when the liquid thermosetting resin used in the continuous lamination process of the present invention is an epoxy resin, the composite product 16 is post-baked for about 0.5 to 3 hours in a chamber heated to a temperature of about 150° C. to about 200°·C.

The composite products obtained in the manner described above in FIG. 1 are subsequently etched to provide circuitization to prepare printed circuit boards.

A circuitized composite product 16 having a relatively thin structural thickness, can be etched and processed for continuous circuitization and then used as the core material for a power plane in the continuous manufacture of multilayer laminated printed circuit boards having a 2s,2p structure. Thus, the composite product 16 prepared in accordance with the process shown in FIG. 1 having a relatively thin structural thickness, e.g. 5-10 mils and stored on a roll can be continuously unwound from roll 26, etched to prepare ground planes and then continuously laminated with additional metal foil and reinforcing cloth sheet layers in a manner similar to that shown in FIG. 1 to implant outside signal planes on the composite product to obtain a laminated multilayer circuit board product having a 2s,2p structure.

Figure 2:
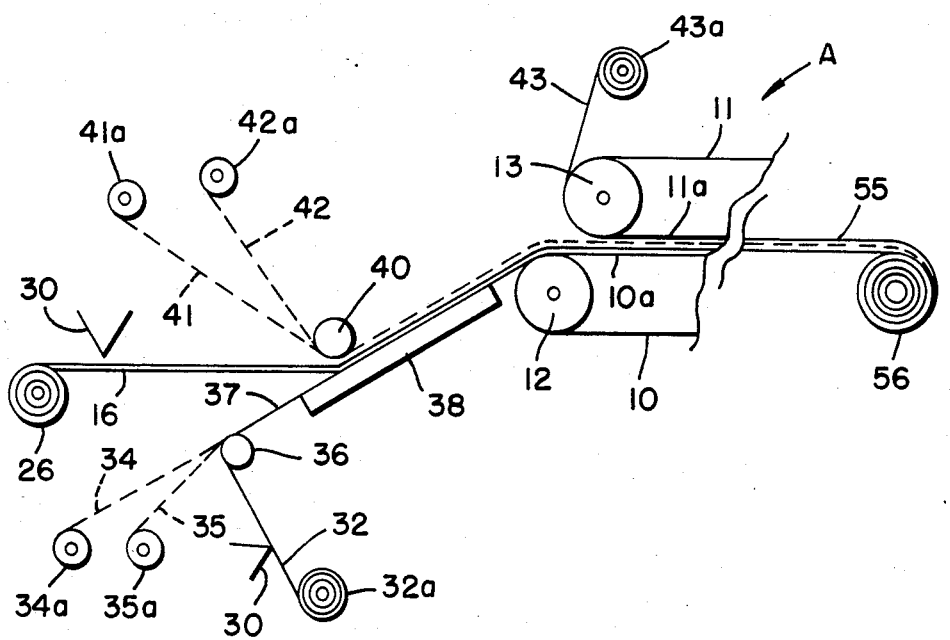
FIG. 2 shows a schematic longitudinal section through a part of the double belt press laminator shown in FIG. 1, namely the sheet feed and resin coating section of the laminator, whereby a multilayer laminated circuit board of 2s,2p construction is manufactured using the composite material produced in accordance with FIG. 1.

The manner in which the process of the present invention may be adapted to the continuous manufacture of circuit boards having a laminated multilayer 2s,2p construction is shown in FIG. 2.

In FIG. 2, there is shown the sheet feed and liquid thermosetting resin application section of the double belt press laminator A of FIG. 1, wherein a plurality of metal foil and reinforcing cloth layers are laminated in a continuous manner to the core product 16 using the process of the present invention to prepare a laminated multilayer product suitable for the preparation of printed circuit boards having a 2s,2p construction.

As shown in FIG. 2, a laminated multilayer circuit board product 55 is fabricated from the composite product 16 produced in accordance with the process illustrated in FIG. 1, by first casting a liquid thermosetting resin from a coater device 30 onto the top surface of a metal foil 32 as the foil is unwound from supply roll 32a. The coated metal foil 32 and reinforcing cloths 34,35 unwound from supply rolls 34a,35a are assembled together as they pass over the roll 36 to form assembly 37. Assembly 37 is passed over heater plate 38 simultaneously with coated composite product 16 and passed under guide roll 40. As the coated composite product 16 and the assembly 37 pass under the guide roll 40, the uncoated bottom surface of the composite product 16 is placed into contact with the top reinforcing cloth surface of the assembly 37. Also passed simultaneously under guide roll 40 are reinforcing cloths 41,42 unwound from supply rolls 41a,42a respectively, whereby the bottom surface of cloth 41 is placed into contact with the coated surface of the composite product 16 as it is passed under the roll 40 and over the heating plate 38. As the assembled metal foil and reinforcing cloth layers enter the gap between the mutually facing sides 10a,11a of the double press belts 10,11, a metal foil 43 is unwound from supply roll 43a and also fed into the gap into contact with the top surface of the reinforcing cloth 42 whereby the individually fed metal foils and reinforcing cloths are joined together with the composite product 16 under the effect of heat and pressure in the same manner previously described in FIG. 1.

As the resin coated metal foil 32 and the resin coated composite product 16 are passed over the heating plate 38, these substrates are heated to a temperature below the curing temperature of the liquid thermosetting resin whereby the heat thinned resin coated on the surfaces of the foil 32 and composite 16 permeates and impregnates the assembled reinforcing layers 34,35 and 41,42 as they are passed into contact with the resin coated metal foil 32 and composite product 16. The assembled resin coated metal foil 32 and resin coated composite product 16 together with reinforcing cloths 34,35,41 and 42 are passed through the double belt press laminator A in the manner previously described to produce a laminated multilayer circuit board product. The laminated product 55 is cut into desired predetermined panel lengths or wound and collected on roll 56.

If desired, the laminated multilayer product 55 may undergo a post lamination heat treatment to effect a more complete cure of the laminate. Thereafter an external circuit pattern is etched into the outer metal foil layers to prepare a printed circuit board product having a 2p,2s construction.

The reinforcing cloth used in the preparation of the circuit boards of the present invention are prepared from woven or non-woven filaments of dimensionally stable fibers such as fibers of glass, boron nitride, carbon (including carbonaceous, graphitized and flame resisting fibers) and silicon carbide. Glass fiber cloths are preferred for use in the preparation of laminates used in the fabrication of printed circuit boards. The reinforcing glass fiber cloths are conventionally coated, prior to assembly with the metal foil, with a coupling agent such as an aminosilane which promotes the adhesion of the liquid thermosetting resin composition to the surface of the cloth.

The term "liquid thermosetting resin composition" as used herein refers to one that does not contain any solvent component but only components wholly convertible into a resinous solid by a thermosetting curing reaction without the generation of water, carbon dioxide or the like as by-products. The composition is therefore composed of resins of the radical polymerization or addition polymerization type, for example, unsaturated polyester resin, vinyl ester resin (or epoxy-acrylate resin) and epoxy resin.

In addition, the liquid thermosetting resin composition may contain other components which carry out or accelerate its curing. For example, a liquid unsaturated polyester may contain components such as cross-linking polymerizable monomers and curing accelerators; epoxy resins may contain curing agents.

Epoxy resins are preferred to use in the practice of the present invention. Generally speaking, the multilayer printed circuit board technology today employs, in the main, epoxy resins in combination with glass fiber reinforcing cloths for the formation of prepreg sheets. Epoxy resin systems exhibit high dielectric strength, good moisture resistance, good chemical resistance and good resistance to both mechanical and electrical shock, and epoxy/glass cloth laminates represent the most efficient structures in terms of strength to weight in existence at the present time. Epoxy resins can be aliphatic, cycloaliphatic, aromatic, heterocyclic and the like and may carry such inert substituents as chlorine and others well known and commonly encountered in the art. In the formation of epoxy resins suitable for use in the practice of the present invention, there can be used virtually any epoxide produced from a polyhydric alcohol of phenol and an epihalohydrin. Typical of the epoxides that can be used successfully, are those produced from epichlorohydrin and a polyhydric phenol or alcohol such as resorcinol, catechol, 1,2,6-hexanetriol, sorbitol, mannitol, pentaerythritol, trimethylopropane and glycerol allyl ether. Similarly, polymeric materials containing polyhydric hydroxyls such as appropriately substituted polyethers and polyesters can likewise be employed. For example, there may be employed vinyl cyclohexane dioxide, epoxidized mono-, di and tri-glycerides, butadiene dioxide, 1,4-bis(2,3-epoxypropoxy)benzene, 1,3-bis(2,3-epoxypropoxy)benzene, 4,4'bis(2,3-epoxypropoxy)diphenyl ether, 1,8-bis(2,3-epoxypropoxy)octane,1,4-bis(2,3-epoxypropoxt)cyclohexane, 4,4'-bis(2-hydroxy-3,4-epoxybutoxy)diphenyldimethylmethane, 1,3-bis(4,5-epoxypentoxy)-5-chlorobenzene, 1,4-bis(3,4-epoxybutoxy)2-chlorocyclo-hexane, diglycidyl thioether, diglycidyl ether, ethylene glycol diglycidyl ether, resorcinol diglycidyl ether, 1,2,5,6-diepoxyhexane-3, 1,2,5,6-diepoxyhexane, and 1,2,3,4-tetra(2-hydroxy-3,4-epoxybutoxy)butane.

Particularly preferred are epoxides prepared from bis-phenol-A (2,2-bis[4-hydroxyphenyl]propane) phenols or cresols and epichlorohydrin. Especially suitable are bisphenol A-epichlorohydrin polyepoxide resins of the formula

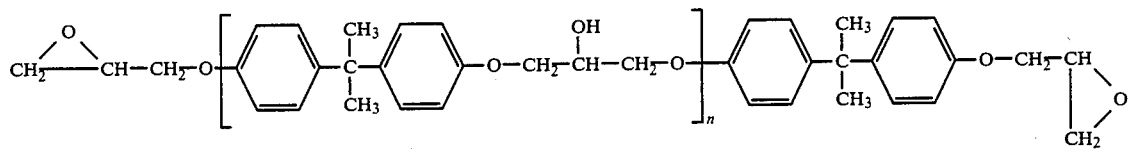

and epoxidized poly(o-cresols) of the formula

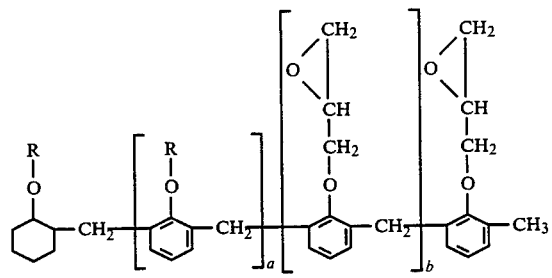

wherein n, a and b are positive numbers and R represents chlorohydrins, glycols, polymeric ether linkages and the like.

Curing catalysts are incorporated in the epoxy resin system to effect the ultimate cure of the resin. Catalysts incorporated in the epoxy resins are those normally employed in the art to produce polymerization of the epoxy resin by reaction of the oxirane ring. Curing catalysts, suitable for use in the practice of the present invention include, amines or amides such as aliphatic, cycloaliphatic or aromatic, primary, secondary and tertiary amines, for example monoethanol-amine, ethylene diamine, hexamethylene diamine, trimethylhexamethylene diamine, diethylene triamine, triethylene tetramine, tetraethylene pentamine, N,N-di-methylpropylene diamine-1,3,N,N-diethylpropylene diamine 1,3,2,2-bis(4'-aminocyclohexyl)propane, 3,5,5-trimethyl-3-(aminomethyl)-cyclohexylamine, 2,4,6-tri-(dimethylaminomethyl)phenol, benzyldimethylamine, dicyandiamide,benzoguanamine, imidazole, isoniazide, tetramethyl diamine, benzyl dimethylamine, meta-phenolene diamine and N,N,N',N'-tetramethyl-1, 3-butadiamine.

The curing catalyst is incorporated in the epoxy resin system at a concentration of about 0.5 to about 10 percent by weight and preferably about 1 to about 3 percent by weight.

A preferred epoxy resin formulation useful as a liquid thermosetting resin in the practice of the present invention is an epoxy-styrene composition comprised of a mixture of about 50-90 parts by weight of a polyepoxide, about 1-50 parts by weight of a styrene monomer, about 0.25-2.0 stoichrometric equivalents based on the polyepoxide of an acid anhydride such as trimellitic anhydride, 3,3'4,4'-benzophenone tetracarboxylic anhydride or chlorendic anhydride, an accelerating amount of an accelerator compound such as an onium compound such as a quarternary ammonium halide or a phosphonium halide and a curing amount of a free radical curing agent such as a peroxide such as 2,5-dimethyl-2,5-bis(tertiary-butylperoxy)hexane. These preferred epoxy resin formulations are more fully disclosed in U.S. Pat. No. 4,284,753 and are available from the Shell Chemical Company under the trademark EPON RSL 941.

Epoxy resins when used as the liquid thermosetting resin composition in the practice of the present invention are formulated to provide a liquid composition of conveniently handled viscosity generally having a Brookfield viscosity at 21° C. of about 3000 to about 5000 centipoise.

The following non-limiting example is presented to further illustrate the present invention.

EXAMPLE

Using a double belt press laminator of the type shown in FIG. 1, a liquid thermosetting epoxy resin available under the trademark EPON RSL 941 from the Shell Chemical Company was continuously applied at a film thickness of 10 mils to the upper surface of a 1.4 mil electrolytic copper foil which was continuously unwound from a supply roll. The epoxy resin coated copper foil was continuously passed, at the rate of 8 fpm over a heating plate heated at 85° C. to fluidize the resin. A second identical copper foil and a pair of fiber glass cloths having a thickness of 3 mils were continuously unwound from their respective supply rolls and passed together with the resin coated copper foil at the rate of 8 fpm to the heating zone of the double press laminator which was maintained at a temperature of 160° C. In the heating zone, the copper foils and fiber cloths were compressed together at a pressure of 50 psi, this pressure being sufficient to cause the fluidized epoxy resin to flow and impregnate the glass cloths and permeate therethrough to contact the lower surface of the second copper foil. The total residence time of the copper foil/cloth assembly in the heating zone was 120 seconds. After passage through the heating zone, the copper foil/glass cloth assembly was continuously passsed through the cooling zone maintained at 50° C. The collected composite product was postbaked at 190° C. for 60 minutes.

The composite product obtained was a flexible copper clad laminate having a thickness of 8 mils − +1 mil. In spite of the short time bonding under low pressure, the flow and adhesion to the glass cloths and second copper foil were excellent after post cure. The 180° C. Tg after post cure provides enhanced thermal stability through relamination and subsequent component solder operations.

We claim:
1. A method for the continuous manufacture of a composite circit board which comprises the continuous steps of
coating the surface of a metal foil with a layer of a liquid thermosetting resin free of a volatile solvent,
heating the foil to a temperature below the curing temperature of the resin to further fluidize the resin,
advancing the heated resin coated foil into contact with a sheet of reinforcing cloth to form a foil/cloth assembly,
continuously conveying the assembly between a pair of rotating endless belts having mutually facing surfaces mutually pressable against one another in a heating zone heated to the curing temperature of the resin,
pressing the mutually facing surfaces of the belts against the assembly to simultaneously compress the assembly and impregnate the assembly with the resin,
curing the resin in the heating zone whereby there is formed a composite structure bonded together with the cured resin, and then
cooling the composite structure while the belts remain pressed against the composite structure to obtain the circuit board.

2. The method of claim 1 wherein the metal foil is copper foil.

3. The method of claim 1 wherein the reinforcing cloth is a glass fiber cloth.

4. The method of claim 1 wherein the liquid thermosetting resin is an epoxy resin.

5. The method of claim 4 wherein the epoxy resin is an epoxy-styrene composition.

6. The method of claim 1 wherein the composite structure is compressed by the belts at a pressure of about 30 to about 50 psi.

7. The method of claim 1 wherein the metal foil layers of the cooled composite are etched to form circuits to obtain a printed circuit board.

8. The method of claim 7 wherein the composite board has subsequently applied thereto a plurality of metal foil and reinforcing cloth layers to form a multilayer laminated circuit board.

* * * * *